United States Patent

Matsuyama et al.

Patent Number: 5,851,681
Date of Patent: Dec. 22, 1998

[54] WIRING STRUCTURE WITH METAL WIRING LAYERS AND POLYIMIDE LAYERS, AND FABRICATION PROCESS OF MULTILAYER WIRING BOARD

[75] Inventors: Haruhiko Matsuyama, Hiratsuka; Eiji Matsuzaki, Yokohama; Shozi Ikeda, Yokohama; Fumio Kataoka, Yokohama; Fusaji Shoji, Yokohama, all of Japan

[73] Assignee: Hitachi, Ltd., Tokyo, Japan

[21] Appl. No.: 212,766

[22] Filed: Mar. 15, 1994

[30] Foreign Application Priority Data

Mar. 15, 1993 [JP] Japan ................... 5-054318

[51] Int. Cl.$^6$ .............. G11B 5/40; C08G 69/26
[52] U.S. Cl. ............ 428/473.5; 428/209; 428/458; 428/694 ML; 174/258; 528/353
[58] Field of Search ................ 428/209, 473.5, 428/615, 618, 458, 694 ML; 174/258

[56] References Cited

U.S. PATENT DOCUMENTS

| 4,587,197 | 5/1986 | Kojima et al. ............ 430/196 |
| 4,686,147 | 8/1987 | Matsuyama et al. ....... 428/447 |
| 4,772,505 | 9/1988 | Matsuyama et al. ....... 428/209 |
| 4,824,731 | 4/1989 | Matsuyama et al. ....... 428/473.5 |
| 5,208,656 | 5/1993 | Matsuyama et al. ....... 174/253 |
| 5,601,905 | 2/1997 | Watanabe et al. ......... 428/215 |

FOREIGN PATENT DOCUMENTS 63-143846  6/1988  Japan .

OTHER PUBLICATIONS

Shih, et al., 42nd Electric Compounds and Technology Conference, pp. 1002–1014, 1992.
U.S. Ser. No. 7742044, filed Aug. 8, 1991.
Advanced Organic Chemistry, 3rd Edition; Francis A. Carey and Richard J. Sundberg.

*Primary Examiner*—Cathy F. Lam
*Attorney, Agent, or Firm*—Antonelli, Terry, Stout & Kraus, LLP

[57] ABSTRACT

This invention relates to a wiring structure having metal wiring layers and polyimide layers. An object of this invention is to overcome problems caused by oxidation of a metal surface, such as an increase in the resistance of wiring and a reduction in insulation, by preventing a reaction between a metal of the wiring layers, such as copper, and carboxyl groups of polyamic acid which make up the polyimide layers. In the wiring structure according to the present invention, the polyimide layers have been formed by heating and curing a resin composition which comprises a polyimide precursor, an amine compound and an organic solvent.

14 Claims, 1 Drawing Sheet

WIRING STRUCTURE WITH METAL WIRING LAYERS AND POLYIMIDE LAYERS, AND FABRICATION PROCESS OF MULTILAYER WIRING BOARD

BACKGROUND OF THE INVENTION

1) Field of the Invention

This invention relates to a wiring structure with metal wiring layers and polyimide layers, such as a multilayer wiring board, and also to a fabrication process of a multilayer wiring board.

2) Description of the Related Art

Multilayer wiring boards employed in computers are each formed by alternately stacking wiring layers and insulating layers on a substrate. Connection between each wiring layer and its upper or lower wiring layer is achieved via through-holes formed in the insulating layer disposed between the wiring layers.

As materials in such multilayer wiring boards, Cu having low resistivity and polyimide resin having low specific inductive capacity and excellent heat resistance, film formability and through-hole machinability are finding increasing utility as a conducting material and an insulating material, respectively, reflecting speed-up of signals in recent years as described, for example, in The 42nd Electronic Components & Technology Conference, pp 1002–1014.

Further, wiring structures which are each formed of copper wiring and polyimide insulating layers are used as thin-film magnetic heads, thermal heads or the like.

If a polyimide insulating film is formed on Cu wiring by using the above-described conventional art, however, problems arise in connection with reliability and fabrication yield as will be described below. Use of a measure to avoid such problems, however, leads to a problem in fabrication cost. It has therefore been extremely difficult to overcome both problems.

Regarding the former problems, that is, the problems in reliability and fabrication yield, it has been the practice of the conventional art to form each polyimide insulating layer by coating a varnish of polyamic acid, a polyimide precursor, on Cu wiring and then heating and curing the varnish. Here, carboxyl groups in the skeleton of the polyamic acid react with Cu. Cu wiring therefore has, as problems, surface oxidation and increased wiring resistance. A polyimide insulating film which has been formed by heating and curing is reduced in heat resistance under the influence of Cu ions dissolved out through reactions into the film. Because of exposure to heat in subsequent steps required for the formation of a multilayer wiring board, such as upper insulating film forming steps and a reflow soldering step upon connection of LSI, interlaminar blistering, void formation and the like may take place due to gas produced upon decomposition of the polyimide of the insulating film, leading to problems in fabrication yield and reliability.

As methods for preventing such problems, it has been proposed to improve the polyamic acid as the polyimide precursor. Described specifically, illustrative of such methods include esterification of the above-described carboxyl groups in the skeleton of the polyamic acid, the carboxyl groups being reactive with Cu, and pre-imidation of such carboxyl groups to eliminate reactive sites. Use of these methods however makes it impossible to use the conventional simple synthesis wherein an acid dianhydride and a diamine are subjected to polycondensation in a solution, resulting in the drawback that the material cost, that is the fabrication cost of a multilayer wiring board, rises sharply. It has also been proposed to protect a Cu surface with Cr or Ni. This method however involves problems such that it requires more fabrication steps and hence higher fabrication cost and the surface resistance of the wiring becomes greater and upon transmission of high-frequency signals, the influence of the surface effect is great and a delay may be caused in the propagation of the signals.

SUMMARY OF THE INVENTION

An object of the present invention is therefore to provide a wiring structure with wiring layers and polyimide layers, the wiring structure being free of such problems, having high fabrication yield and reliability and permitting low-cost fabrication, and also a fabrication process of a multilayer wiring board.

This invention relates to a wiring structure with metal wiring layers and polyimide layers, in which each of the polyimide layers is a layer which has been formed by heating and curing a resin composition comprising a polyimide precursor, an amine compound and an organic solvent. The term "wiring structure with metal wiring layers and polyimide layers", to which the present invention relates, includes all wiring structures with metal wiring layers and polyimide layers arranged in a contiguous relation, such as thin-film magnetic heads, thermal heads and the like in addition to multilayer wiring boards.

In the wiring structure according to the present invention, each metal wiring layer is a wiring layer of a metal, such as copper, having the potential problem that the metal may react with carboxyl groups in the polyamide acid. Compared with aluminum employed in general wiring, copper has lower resistivity, that is, 60%, three-fold electromigration resistance, and superior electrical characteristics. Copper is therefore advantageous for the materialization of a high-density multilayer wiring by forming a microcircuit. The present invention can however be effectively applied not only to copper but also to all metal wiring layers having a potential problem of reacting with polyamic acid. For example, there is the potential problem that nickel coated on copper wiring may also be oxidized with the polyamic acid. The present invention can however prevent such oxidation of nickel.

The polyimide precursor contained in the resin composition for the formation of the polyimide layer in this invention can desirably be one represented by the following formula (1) from the standpoints of heat resistance and thermal and mechanical properties:

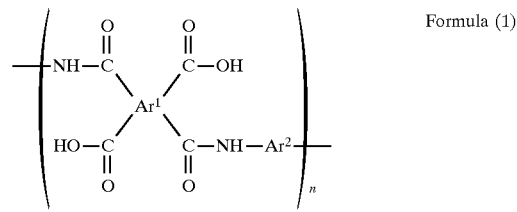

Formula (1)

wherein $Ar^1$ represents at least one tetravalent organic group selected from the following formulas (2):

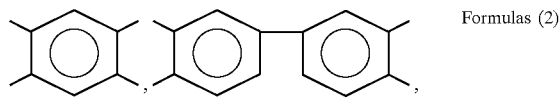

Formulas (2)

-continued

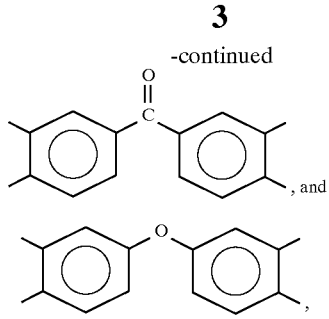
, and $Ar^2$ represents at least one divalent organic group selected from the following formulas (3):

Formulas (3)

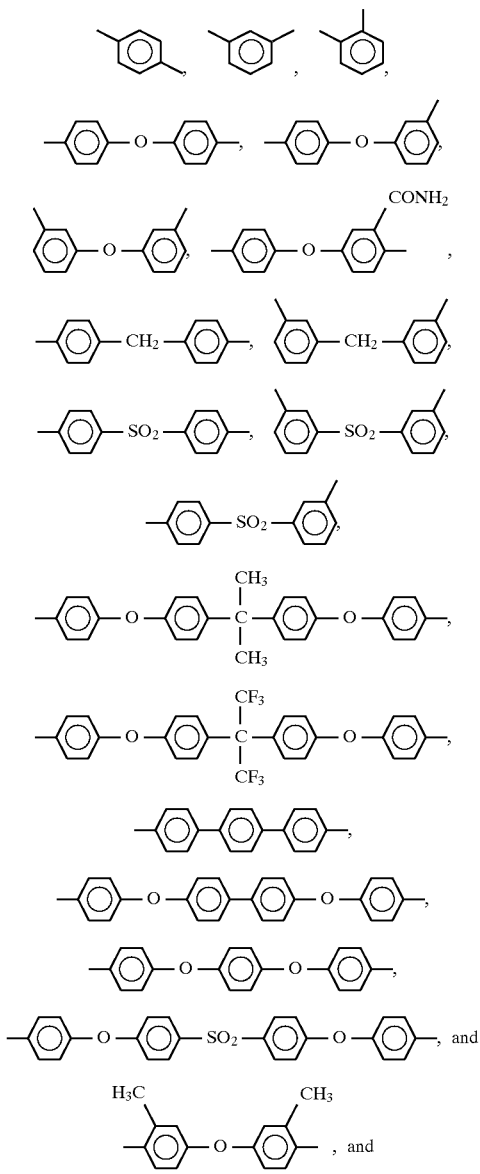

n stands for a positive integer.

The polyimide precursor may be a polymer end-capped at each end thereof with a silicon-containing hydrocarbon group. In general, it is possible to use a polyimide precursor which can be used for insulating layers or a-ray shielding films in a wiring structure.

The resin composition useful in the practice of the present invention contains the amine compound. This amine compound is added as protecting groups to carboxyl groups of the polyimide precursor, thereby preventing the reaction between the metal of the wiring layer, such as copper, and the carboxyl groups. When the resin composition is heated and cured, the amine compound is caused to evaporate or sublimate and is eliminated out of the composition. To impart this evaporating or sublimating property, it is desired for the amine compound to contain in its molecule one of a group having a hydrogen atom bonded to a tertiary carbon atom, a group having a hydrogen atom bonded to a secondary carbon atom and a group having an unsaturated bond. Here, the term "tertiary carbon atom" means a carbon atom three of whose four bonds are bonded with atoms other than a hydrogen atom, and the term "secondary carbon atom" means a carbon atom two of whose four bonds are bonded with atoms other than a hydrogen atom. Specific examples of these amine compounds include those represented by the following formulas (4), (5) or (9):

Formula (4)

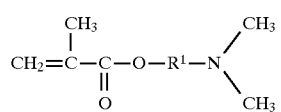

wherein $R^1$ represents an alkylene group having 1–6 carbon atoms,

Formula (5)

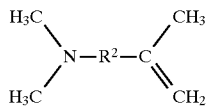

wherein $R^2$ represents an alkylene group having 1–6 carbon atoms, and

Formulas (9)

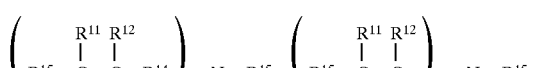

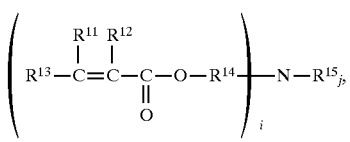

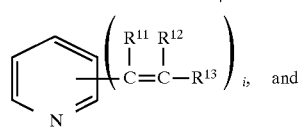

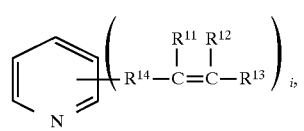

wherein $R^{11}$, $R^{12}$, $R^{13}$ and $R^{15}$ individually represent a hydrogen atom or a group selected from a $C_{1-4}$ alkyl group, a phenyl group or a vinyl group, $R^{14}$ represents an alkylene group, $R^{15}$ represents a group selected from a $C_{1-4}$ alkyl group, a phenyl group or a vinyl group, i+j=3, and i=1 to 3.

Specific examples of amine compounds usable in the present invention include allylamine, diallylamine, triallylamine, 2-methyl-2-butenylamine, 1,3-dimethyl-1-propenylamine, 2,4-pentadienylamine, tri(2-butenyl)amine, di(2-methyl-2-propenyl)amine, tri(2-methyl-2-propenyl) amine, 2-(N,N-dimethylamino)ethyl cinnamate, 3-(N,N-dimethylamino)propyl acrylate, 3-(N,N-dimethylamino) propyl methacrylate, 3-(N,Ndimethylamino)propyl cinnamate, N,N-dimethylallylamine, N-methyldiallylamine, N-propyldiallylamine, 2-vinylpyridine, 4-vinylpyridine, 2-vinyl-6-methylpyridine, 2-vinyl-5-ethyl pyridine, 4-butenylpyridine, 4-(1-propenylbutenyl)pyridine, 4-pentenylpyridine, and 4-(1-butenylpentenyl)pyridine. Further, examples of amines with a group having a hydrogen atom bonded to a tertiary carbon atom include those represented by the following formulas (10) and illustrative amines with a group having a hydrogen atom bonded to a secondary carbon atom include those represented by following formulas (11):

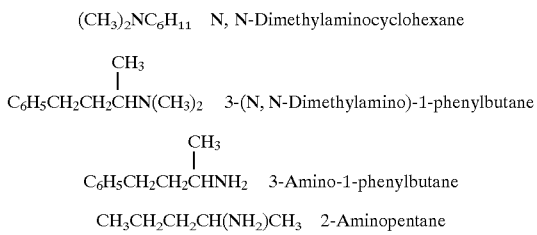

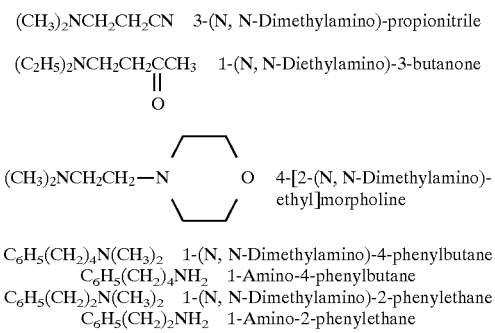

As further examples of amines with a group having a hydrogen atom bonded to a secondary carbon atom, those represented by the following formula (12) can also be mentioned:

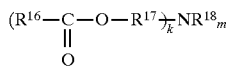

wherein $R^{16}$ represents an alkyl group having 1–6 carbon atoms, $R^{17}$ represents an alkylene group having 1–4 carbon atoms, $R^{18}$ represents an alkyl group having 1–4 carbon atoms, $k+m=3$, and $k=1$ to 3.

Specific examples of these amines include 2-(N,N-dimethylamino)ethylacetate, 2-(N,N-dimethylamino) ethylpropionate, 2-(N,N-dimethylamino)ethylbutanoate, 2-(N,N-dimethylamino)ethylhexanoate, 3-(N,N-dimethylamino)propylacetate, 3-(N,N-dimethylamino) propylpropionate, 3-(N,N-dimethylamino)propylbutanoate, 3-(N,N-dimethylamino)propylhexanoate, 3-(N,N-diethylarnino)propylacetate, 3-(N,N-diethylamino) propylpropionate, 3-(N,N-diethylamino)propylbutanoate, and 3-(N,N-diethylamino)propylhexanoate.

As the organic solvent, an aprotic polar solvent is preferred from the standpoint of stabilizing the viscosity upon preparation of a varnish. Specific examples of the aprotonic polar solvent include N-methyl-2-pyrrolidone, N-acetyl-2-pyrrolidone, N-benzyl-2-pyrrolidone, N,N-dimethylformamide, N,N-dimethylacetamide, dimethylsulfoxide, and N-acetyl-ε-caprolactam. They can be used either singly or in combination.

In the resin composition employed in the present invention, the amine compound can desirably be contained in an equivalent amount 0.5–2 times as much as carboxyl groups in the polyimide precursor. Even if carboxyl groups are present in the free form, they may not cause any substantial problem provided that free carboxyl groups do not exceed about 50% of all the carboxyl groups. If the amount of the amine compound is smaller than that sufficient to limit free carboxyl groups below the above percentage, the effect of the amine compound for the prevention of the reaction with Cu is lowered. From the viewpoints of the uniformity of a film thickness upon coating a varnish and the stability of the viscosity of the varnish, the organic solvent can preferably amount to 50–95 wt. % of the whole amount of the resin composition. If the amount of the organic solvent is smaller than the preferred lower limit, the concentration of the polyimide precursor in the varnish becomes unduly high so that the varnish becomes susceptible to gelation. If the amount of the amine compound or the organic solvent exceeds the preferred upper limit, the relative amount of the polyimide precursor in the varnish becomes smaller, resulting in an unduly low solid polymer content. This causes a reduction in fabrication yield, reliability, productivity and the like, because such a varnish can form only an excessively thin film and tends to result in the occurrence of pinholes and a film-forming step must hence be repeated to achieve a predetermined film thickness.

Where the wiring structure having the metal wiring layers and polyimide layers is a multilayer wiring board in the present invention, the metal wiring layers and the polyimide layers—which are formed by heating and curing the resin composition formed of the polyimide precursor, the amine compound and the organic solvent'are alternately stacked one over the other on at least one side of a base substrate which has an internal wiring layer and power-feeding and/or signal i/o terminals. On a surface of a stacked uppermost layer, a thin-film circuit layer having electrodes for at least one use of power-feeding and signal i/o is then formed.

A process for the fabrication of a multilayer wiring board having such a construction comprises: (1) heating and curing a resin composition, which comprises a polyimide precursor, an amine compound and an organic solvent, on one side of a ceramic substrate having an internal wiring layer and power-feeding and/or signal i/o terminals, whereby an organic insulating layer is formed, (2) forming through-holes in the organic insulating layer to permit connection of the terminals with a metal wiring layer to be formed on the organic insulating layer, (3) forming the metal wiring layer on the organic insulating layer, (4) heating and curing the resin composition to form another organic insulating layer, (5) forming further through-holes in the another organic insulating layer to permit connection of the metal wiring layer with another metal wiring layer to be formed on the another organic insulating layer, (6) repeating steps (3) to (5) as many times as needed, and (7) forming power-feeding and/or signal i/o electrodes, required for connecting the multilayer wiring board with an LSI. As conditions for the heating and curing described under (1), the atmosphere can preferably be, from the viewpoint of prevention of oxidation of Cu, an inert gas, such as nitrogen or argon, in which the concentration of oxygen is limited to 50 ppm or less; a forming gas prepared by adding hydrogen to the inert gas; or a vacuum. The temperature and time can be similar to those employed as curing conditions for varnishes of conventional polyimide precursors. It is however preferred to employ such conditions that the varnish is first precured at 100°–200° C. for 5–200 minutes to ensure sufficient evaporation of the solvent at an initial stage of the film forming and is then subjected to full curing at 300°–450° C. for 10–120 minutes to complete the imidization.

PREFERRED EMBODIMENTS OF THE INVENTION

Figure 1:
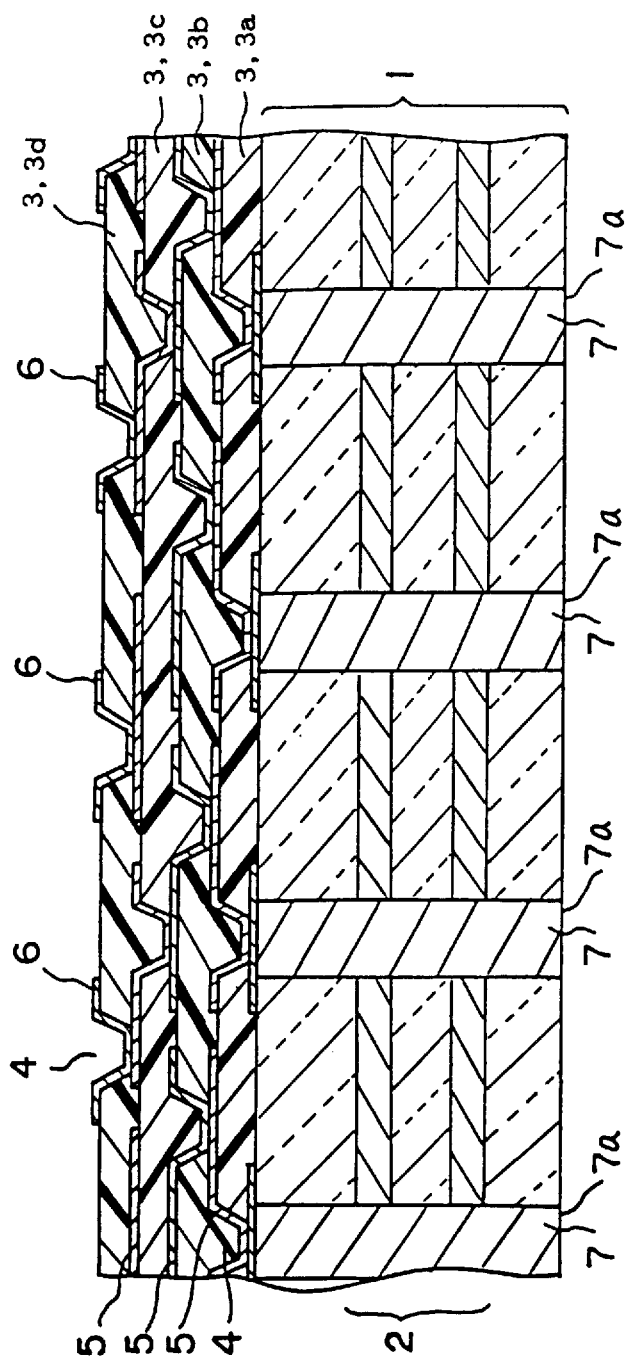
FIG. 1 illustrates a cross-sectional structure of a multilayered printed board according to the present invention.

In the wiring structure according to the present invention, each polyimide layer has been formed by heating and curing the resin composition which is formed of the polyimide precursor, the amine compound and the organic solvent. In the resin composition, the amine compound undergoes ionic bonding with carboxyl groups in the polyimide precursor to form protecting groups as shown, for example, by the below-described reaction formula (6). The reactivity of the carboxyl groups has hence been masked.

Reaction formula (6)

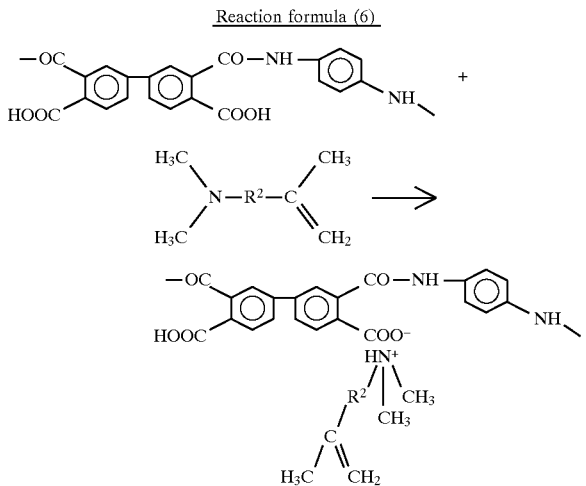

wherein $R^2$ represents an alkylene group having 1–6 carbon atoms.

As a consequence, the reaction between the metal of the metal wiring layer and carboxyl groups can be prevented when the resin composition is brought into contact with each metal wiring layer.

The formation of ionic bonding between the amine compound and the carboxyl groups in the resin composition employed in the present invention does not require such an esterified polyimide precursor or modification of a polymer even at the stage of its synthesis as in an imidated varnish, as described above in connection with the related art, so that neither a costly raw material nor a complex procedure is needed. It is only necessary to prepare a polyimide precursor varnish from the polyimide precursor and the organic solvent in a manner known per se in the art, to add the amine compound into the varnish and then to stir the resultant mixture into a homogeneous varnish.

When the varnish is heated and cured to convert the polyimide precursor into the corresponding polyimide, the amine compound forming ionic bonding with the polyimide precursor is eliminated out of the composition. Accordingly, the polyimide layer formed subsequent to the heating and curing has excellent heat resistance, mechanical properties and electrical properties.

The present invention will hereinafter be described using examples. It should however, be borne in mind that the following examples are merely to illustrate the present invention and should not be taken as limiting it whatsoever.

EXAMPLE 1

The multilayer wiring board of FIG. 1 was fabricated as will be described hereinafter.

A wiring material was printed on a green sheet to provide a preform. That procedure was repeated to provide plural preforms. Those preforms were stacked one over the other and were then compression-bonded. They were then fired to form a thick-film substrate 1. Cordierite was used as the material of the substrate, whereas Cu was used as a material for internal wiring layers 2. Incidentally, the internal wiring layers 2 include through-holes 7. One end of each through-hole 7 constitutes a terminal 7a for connection.

The thick-film substrate 1 was next spin-coated with a resin composition. The resin composition had been prepared by adding 11 parts by weight of an amine compound represented by the following formula (8):

Formula (8)

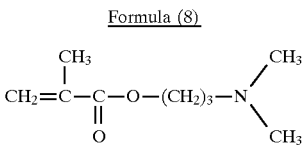

to 100 parts by weight of a polyimide precursor varnish having a solid content of 15 wt. % and containing a polyimide precursor represented by the following formula (7):

Formula (7)

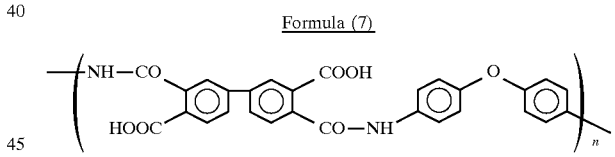

and, as a solvent, N-methyl-2-pyrrolidone. The thus-coated thick-film substrate 1 was heated at 100° C. for 1 hour, at 200° C. for 1 hour and then at 350° C. for 1 hour in a nitrogen gas stream, whereby the resin composition was cured and an organic polyimide insulating layer 3a (thichness: 8 μm) was formed. On the polyimide insulating layer 3a, an etching resist pattern was formed using "ONNR-20" (trade name for a negative photoresist; product of Tokyo Ohka Kogyo Co., Ltd.). Using an etchant containing hydrazinehydrate and ethylenediamine at a volume ratio of 7:3 and controlled at 30° C., through-holes 4 were formed. The organic insulating layer 3a with the through-holes 4 formed therein was subjected to sputter cleaning, followed by successive formation of a Cr film to a thickness of 0.05 μm and a Cu film to a thickness of 4 μm, both by sputtering. Those Cr and Cu films were patterned using a conventionally-known photoetching process, whereby a metal wiring layer 5 was formed. Next, an organic insulating layer 3 (3b, 3c), through-holes 4 and a metal wiring layer 5 were alternately formed in a similar manner. Those procedures were repeated twice. In addition, an organic insulating layer 3d and through-holes 4 were also formed in a similar manner. Thereafter, the uppermost organic insulating layer 3d with the through-holes 4 formed therein was subjected to sputter cleaning, followed by the successive formation of a Cr film to a thickness of 0.05 μm, a Ni—W alloy film to a thickness of 3 μm and an Au film to a thickness of 0.1 μm, all by sputtering. Those films were then patterned using a conventionally-known photoetching process, thereby forming electrodes 6 for at least one use of power-feeding and signal i/o, on the surface layers required for connection with an LSI.

The concentration of Cu element in each organic insulation layer 3 at a location near the adjacent metal wiring layer 5 (5 μm inner from each surface between Cu of the metal wiring layer 5 and the organic insulation layer 3) in the board fabricated as described above was measured by SIMS (secondary ion mass spectroscopy). The concentration was found to have a value in the order of about 10–20 and was hence at such a level to involve no problem in insulating resistance. Similar results were also obtained in wiring resistance.

EXAMPLES 2–6

Multilayer wiring boards were fabricated in a similar manner to Example 1 except that the below-described amine compounds were used instead of the amine compound represented by the formula (8), respectively. Their Cu element concentrations and wiring resistances were measured as in Example 1. The results so obtained were similar to the corresponding results in Example 1. The amine compounds employed in the respective examples are as follows:

Example 2: 3-(N,N-dimethylamino)propyl cinnamate
Example 3: 3-(N,N-dimethylamino)-1-phenylbutane
Example 4: 3-(N,N-dimethylamino)propyl propionate
Example 5: 3-(N,N-dimethylamino)propionitrile
Example 6: 1-(N,N-diethylamino)-3-butanone

COMPARATIVE EXAMPLE

A multilayer wiring board was fabricated in a similar manner to the above examples except that the amine compound represented by the formula (8) was not added as a material for the organic insulating layers 3. The concentration of Cu element in each organic insulation layer 3 at a location near the adjacent metal wiring layer (5 μm inner from the surface between Cu of the metal wiring layer 5 and the organic insulation layer 3) in the board was measured by SIMS. The concentration was found to have a value in the order of about $10^{-15}$ so that a reduction in insulating resistance was observed. Further, the Cu surface of each wiring position exhibited a black oxide color and the wiring resistance was higher. In addition, at the interface of the black oxide color, there was blistering which is believed to have been caused by deterioration of the polyimide of each organic insulating layer 3 under heat.

What is claimed is:

1. A wiring structure comprising a metal wiring layer and a polyimide layer, wherein said polyimide layer is a layer which has been formed by heating and curing a resin composition comprising a polyimide precursor, an amine compound and an organic solvent, and wherein said polyimide precursor is represented by the following formula (1):

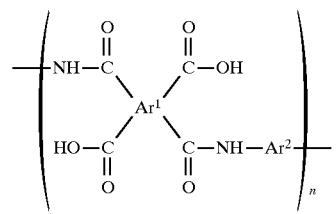

Formula (1)

wherein $Ar^1$ represents at least one tetravalent organic group selected from the following formulas (2):

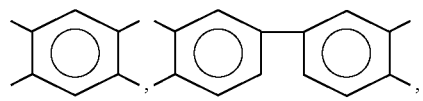

Formulas (2)

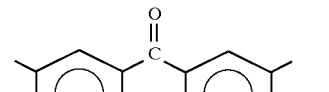

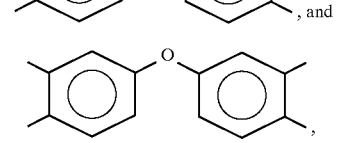

$Ar^2$ represents at least one divalent organic group selected from the following formulas (3):

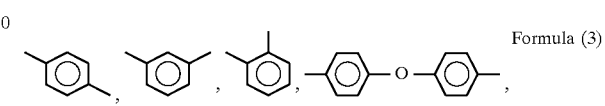

Formula (3)

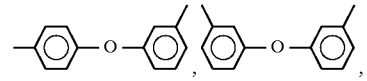

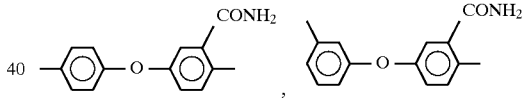

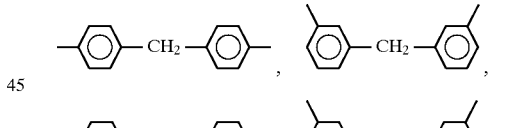

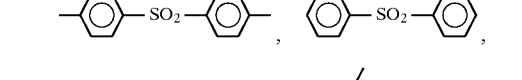

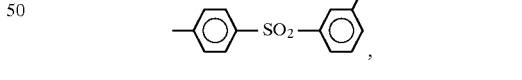

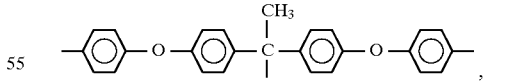

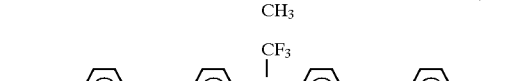

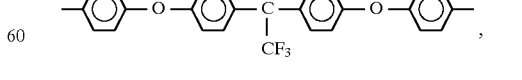

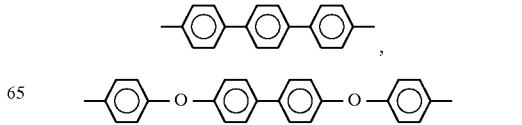

-continued

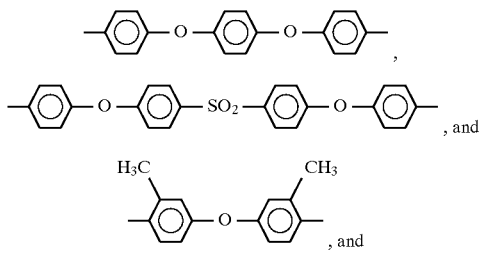

n stands for a positive integer.

2. In a wiring structure with metal wiring layers and polyimide layers, the improvement wherein each of said polyimide layers is a layer which has been formed by heating and curing a resin composition comprising a polyimide precursor, an amine compound and an organic solvent; said resin composition containing said amine compound in an equivalent amount 0.5–2 times as much as carboxyl groups in said polyimide precursor and said organic solvent amounts to 50–90 wt. % of the entire amount of said resin composition, wherein said amine compound is represented by any one of the following formulae (4), (5) and (9):

Formula (4)

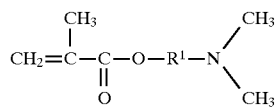

wherein $R^1$ represents an alkylene group having 1–6 carbon atoms,

Formula (5)

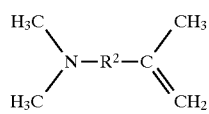

wherein $R^2$ represents an alkylene group having 1–6 carbon atoms, and

Formula (9)

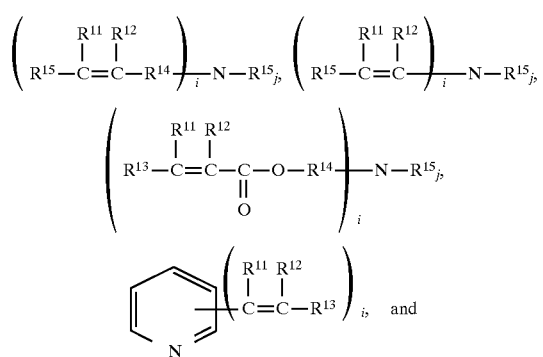

Formula (9)

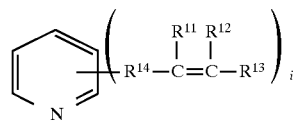

wherein $R^{11}$, $R^{12}$, and $R^{13}$ individually represents a hydrogen atom or a group selected from a $C_{1-4}$ alkyl group, a phenyl group or a vinyl group, $R^{14}$ represents an alkylene group. $R^{15}$ represents a group selected from a $C_{1-4}$ alkyl group, a phenyl group or a vinyl group, i+j=3, and i=1 to 3.

3. A wiring structure according to claim 2, wherein said amine compound has in a molecule thereof:
   (a) a group having a hydrogen atom bonded to a tertiary carbon atom,
   (b) a group having a hydrogen atom bonded to a secondary carbon atom, or
   (c) a group having an unsaturated bond.

4. A wiring structure according to claim 2, wherein said metal wiring layer is copper wiring layers.

5. A wiring structure according to claim 2, wherein said organic solvent is an aprotic aprotonic polar solvent.

6. A wiring structure according to claim 2, which is a thin-film magnetic head.

7. A wiring structure according to claim 2, which is a thermal head.

8. A wiring structure according to claim 2, wherein said amine compound is an amine which prevents reaction between the carboxyl groups and metal of the metal wiring layer, yet which is eliminated from the resin composition during said heating and curing.

9. A wiring structure according to claim 2, wherein said amine compound is a compound which is eliminated from the resin composition during said heating and curing.

10. A wiring structure comprising a metal wiring layer and a polyimide layer, wherein said polyimide layer is a layer which has been formed by heating and curing a resin composition comprising a polyimide precursor, an amine compound and an organic solvent; said resin composition containing said amine compound in an equivalent amount of 0.5–2 times as much as carboxyl groups in said polyimide precursor and said organic solvent amounts to 50–90 wt. % of the entire amount of said resin composition, wherein said amine compound is represented by any one of the following formulae (4), (5) and (9):

Formula (4)

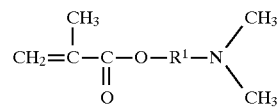

wherein $R^1$ represents an alkylene group having 1–6 carbon atoms,

Formula (5)

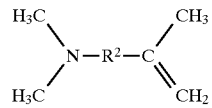

wherein $R^2$ represents an alkylene group having 1–6 carbon atoms, and

Formula (9)

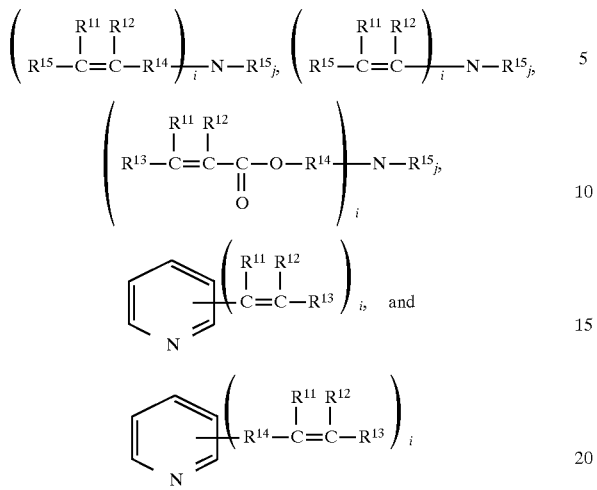

wherein $R^{11}$, $R^{12}$, and $R^{13}$ individually represents a hydrogen atom or a group selected from a $C_{1-4}$ alkyl group, a phenyl group or a vinyl croup, $R^{14}$ represents an alkylene group. $R^{15}$ represents a group selected from a $C_{1-4}$ alkyl group, a phenyl group or a vinyl group, i+j=3, and i =1 to 3.

11. A wiring structure according to claim 10, wherein said amine compound is an amine which prevents reaction between the carboxyl groups and metal of the metal wiring layer, yet which is eliminated from the resin composition during said heating and curing.

12. A wiring structure according to claim 10, wherein said amine compound is a compound which is eliminated from the resin composition during said heating and curing.

13. A wiring structure comprising a metal wiring layer and a polyimide layer, wherein said polyimide layer is a layer which has been formed by heating and curing a resin composition comprising a polyimide precursor, an amine compound and an organic solvent, and wherein said amine compound is represented by any one of the following formulae (4), (5) and (9):

Formula (4)

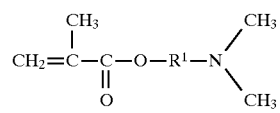

wherein $R^1$ represents an alkylene group having 1–6 carbon atoms,

Formula (5)

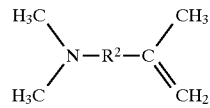

wherein $R^2$ represents an alkylene group having 1–6 carbon atoms, and

Formula (9)

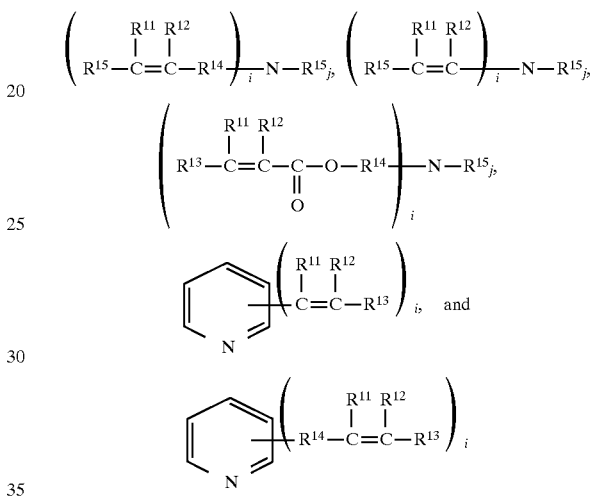

wherein $R^{11}$, $R^{12}$, and $R^{13}$ individually represents a hydrogen atom or a group selected from a $C_{1-4}$ alkyl group, a phenyl group or a vinyl group, $R^{14}$ represents an alkylene group, $R^{15}$ represents a group selected from a $C_{1-4}$ alkyl group, a phenyl group or a vinyl group, i+j=3, and i=1 to 3.

14. A wiring structure according to claim 13, wherein said polyimide precursor is a reaction product prepared using an amine as a reactant, and wherein said amine compound is a compound having a different chemical structure than said amine used for preparation of said polyimide precursor.

* * * * *